United States Patent [19]

Bartelink

[11] Patent Number: 5,567,982
[45] Date of Patent: Oct. 22, 1996

[54] AIR-DIELECTRIC TRANSMISSION LINES FOR INTEGRATED CIRCUITS

[76] Inventor: Dirk J. Bartelink, 13170 La Cresta Dr., Los Altos Hills, Calif. 94022

[21] Appl. No.: 316,195

[22] Filed: Sep. 30, 1994

[51] Int. Cl.⁶ .................................................. H01L 29/41
[52] U.S. Cl. ........................ 257/664; 257/758; 257/276; 257/522
[58] Field of Search .................................. 257/758, 276, 257/522, 664

[56] References Cited

U.S. PATENT DOCUMENTS 5,391,921  2/1995  Kudoh et al. ........................... 257/758

FOREIGN PATENT DOCUMENTS 2-86146   3/1990  Japan ...................................... 257/758
3175657   7/1991  Japan ...................................... 257/664
2247986   3/1992  United Kingdom .................... 257/758

OTHER PUBLICATIONS

Ronald R. Uttecht and Robert M. Gefken, "A Four-Level--Metal Fully Planarized Interconnect Technology for Dense High Performance Logic and SRAM Applications", Jun. 11–12, 1991 VMIC Conference, pp. 20–26.

Michael E. Thomas, Irfan A. Saadat and Satoshi Sekigahama, "Multilevel Microcoaxial Interconnect: A Novel Technology for VLSI Microwave Circuits", Jun. 11–12, 1991 VMIC Conference, pp. 116–122.

Primary Examiner—Jerome Jackson, Jr.

[57] ABSTRACT

The present invention provides an interconnect structure which offers good mechanical stability and reduced charge concentration along the metal-insulator boundary corresponding to lower capacitance. The interconnect structure is comprised of a conductive transmission line structure and a transmission line support structure. The support structure has a "railway trestle-like" construction that provides a braced framework to support the transmission line with a greatly reduced effective dielectric constant. The trestle-like construction of the support structure is comprised of a membrane-like structure and supporting base structure separated by column-like support members. Spaces between the column-like support members form air pockets. The surface of the supporting base structure defines a horizontal axis. The long axis of the column-like support members are typically positioned at a 90 degree angle to the horizontal axis, thus defining a vertical axis support.

3 Claims, 8 Drawing Sheets

AIR-DIELECTRIC TRANSMISSION LINES FOR INTEGRATED CIRCUITS

BACKGROUND OF THE INVENTION

The present invention relates generally to integrated circuit devices and more specifically to air-dielectric transmission lines used in systems for interconnecting transistors and integrated circuit devices.

As integrated circuits become smaller and wiring between transistors becomes more complex, the speed of the circuit becomes increasingly dependent on the metal interconnections between transistors and between integrated circuits. One problem that is particularly critical in high speed digital processors is inter-line capacitance between parallel interconnect lines. The inter-line capacitance found in bus architectures increases cross-talk, while the overall parasitic interconnect capacitance degrades circuit speed performance. Performance can, therefore, be improved by reducing the parasitic capacitance, particularly inter-line capacitance. One way to reduce inter-line capacitance is by using low dielectric constant materials in wiring interconnects.

Significant efforts are also going on in the research community to come up with a low dielectric constant material to replace the widely used silicon dioxide dielectric. Materials developments traditionally take a long time, however, since there are many reliability and manufacturing issues to be examined. As a result, it is advantageous to continue to use a well established materials system and obtain a reduction in cross-talk and parasitic loading by alternative structures.

While it is possible to reduce crosstalk by adding a ground plane or a coaxial shield, the addition of either a ground plane or coaxial shield adds capacitance thus reducing circuit speed. In addition, any added capacitance results in impermissible power dissipation in large chips due to the charging and discharging of the wiring capacitance. Attempts are being made to lower the voltage (V), but circuit frequency (f) is increasing so that power limitations from charging wire capacitance (C) tend to dominate current designs. Power dissipation in circuits is proportional to $CV^2f$.

Since air provides a low dielectric constant (effectively equal to 1) it is an ideal material for reducing inter-line capacitance. Air-dielectric transmission lines are well established in high-speed circuits using III–V group semiconductor materials. Two types of air-dielectric transmission lines in the prior art are the end-supported air bridge shown in FIG. 1 and the dielectric base air-dielectric shown in FIG. 2. The reference "Multilevel Microcoaxial Interconnect: A Novel Technology For VLSI Microwave Circuits" by M. E. Thomas et. al., 1991 VMIC Conference, pages 116–122, describes an end supported air bridge.

In the end-supported air bridge 110 shown in FIG. 1, the metal transmission line 112 is supported at both ends by a conducting cross-support structure 114a,b which is generally orthogonal to the transmission line 112. Since the middle portion 116 of the air bridge 110 is unsupported, the mechanical stability of the transmission line is suspect. Thus, conventional "end-supported" air bridges have not been accepted as feasible in high volume mainstream applications. Further, air is such a poor thermal conductor that heating of transmission line wires 112 is problematic.

FIG. 2 shows a perspective view of a dielectric-base air-dielectric transmission line 210. Unlike the end-supported air bridge 110 shown in FIG. 1, the metal transmission line structure 212 of the dielectric-base transmission line 210 is supported along the entire length by a dielectric base 214. Fabrication of such lines can be accomplished relatively easily for the top-most interconnect lines of integrated circuits by etching portions of the dielectric layer on which the transmission line structure 212 is supported using this structure as an etching mask. The transmission line structure is then surrounded on three sides by air and provides an apparent advantage over a line completely surrounded by a higher (non-air) dielectric. However, while the dielectric base transmission line 210 improves mechanical stability and thermal conductivity, the full width of the dielectric base simply redistributes and concentrates the charge to the point of highest dielectric constant, namely to the interface 216 between the conductive metal transmission line 212 and the dielectric base 214. The result is an improvement in interline capacitance, but only a small reduction in total parasitic capacitance.

The limitations of the dielectric-base air-dielectric transmission line 210 in the prior art are associated with the equality in width of the conducting line 212 and the dielectric base 214 in FIG. 2. To get the full improvement in total parasitic capacitance, the conductive line 212 would have to be almost fully surrounded by air because in that case the charge on the conductive line would be distributed nearly uniformly over its surface. The only exception occurs when the dielectric base 214 on which it rests has a height (h) many times larger than the dielectric width (w). However, the incorporation into an integrated circuit of a layer of dielectric of sufficient thickness to form such a dielectric base would pose an unacceptable manufacturing constraint.

A new approach to fabricating multilevel interconnects is called "damascene" after the inlaid jewelry method. Dual damascene refers to the method of making conducting via connections and conducting transmission lines by respectively etching holes and trenches in a dielectric film with two successive masking operations and filling them with metal. The reference "A four-level metal fully planarized interconnect technology for dense high performance logic and SRAM applications" by R. R. Uttecht and R. M. Geffken, 1991 VMIC Conference, pages 20–26 describes the dual damascene process. The dielectric in these structures fully surrounds the transmission lines just as in conventionally fabricated interconnects. Because the need for lower dielectric constants is so important and manufacturing issues in dual damascene still need to be resolved, research often is directed at new materials such as copper for conductors and polyimide for dielectrics. Simultaneous incorporation of new materials and new structures will make wide acceptance a slow process.

A transmission line which provides a mechanically stable structure, ensures acceptable heat dissipation, and provides low inter-line capacitance and interconnect parasitic loading that can be manufactured with existing materials systems is needed.

SUMMARY OF THE INVENTION

The present invention provides an interconnect structure which offers good mechanical stability and reduced charge concentration along the metal-insulator boundary corresponding to lower capacitance. The interconnect structure is comprised of a conductive transmission line structure and a transmission line support structure. The support structure has a "railway trestle-like" construction that provides a braced framework to support the transmission line with a greatly reduced effective dielectric constant. The trestle-like construction of the support structure is comprised of a membrane-like structure and supporting base structure separated by column-like support members. Spaces between the column-like support members form air pockets. The surface of the supporting base structure defines a horizontal axis. The long axis of the column-like support members are typically positioned at a 90 degree angle to the horizontal axis, thus defining a vertical axis.

The charge concentration at the metal-insulator boundary, which gives rise to most of the total parasitic capacitance, is reduced as the direct result of the geometrical configuration of the support member and the position of its long axis at a 90 degree angle relative to the surface of the supporting base structure. The width of the support member must be made smaller than its height. However, unlike conventional transmission line structures, the width of the support member can be adjusted independently of the width of the conductive structure. Because the support member width can now be reduced, its height can be maintained within the acceptable limits imposed by manufacturing.

The conductive transmission line structure is positioned proximate or adjacent to the membrane-like structure of the transmission line support structure. In one embodiment, the conductive transmission line structure is positioned above the membrane-like structure. In an alternative embodiment, the conductive transmission line structure is positioned below the membrane-like structure. Also, the conductive transmission line structure may include a dielectric base.

The air-dielectric transmission line having the conductive line structure positioned above the membrane-like structure is typically formed according to the following process sequence. Typically, the first step in the fabrication sequence is the formation of a first dielectric layer on the supporting base structure. The supporting base structure or substrate is typically comprised of a semiconductor material such as silicon and the first dielectric layer is typically silicon nitride. A second dielectric layer, typically silicon dioxide, is formed over the first dielectric layer. Using masking techniques well known in the art a photoresist layer is formed on the second dielectric layer and openings are formed in the second dielectric layer. Next, openings in the first dielectric layer are formed typically using a sequence of anisotropic and isotropic etchants. Typically, the photoresist layer is used as a mask for the first anisotropic etch into the first dielectric layer. The photoresist layer may be removed after the first anisotropic etch. Typically, the second dielectric layer (silicon dioxide layer) is used as a mask for the second isotropic etch. The structures remaining after the isotropic etch form narrow column-like support members having a height $h_1$ and a width $w_1$ that act as the support member between the membrane-like structure and the supporting base structure.

After formation of the support members, the openings in the first dielectric layer are closed. Typically, this is done by the isotropic deposition of a dielectric material where deposition continues until the openings in the second dielectric layer are closed The closed dielectric layer forms the membrane-like structure. After closing the openings in the second dielectric layer, a conductive transmission line structure is formed on top of the membrane-like structure according to techniques well known in the art.

In an alternative embodiment of the air-dielectric transmission line, the conductive transmission line structure is positioned below the membrane-like structure. The distinction between the previously described embodiment is that the transmission line structure is positioned below the membrane-like structure and that the support members directly support the conductive transmission line structure. In this case, the role of the membrane-like structure is to support another subsequent transmission line layer placed above. By repeating the layer structure additional times, a multilayer interconnect system may be formed.

The alternative embodiment of the air-dielectric transmission line is typically formed according to the following process sequence: forming a conductive structure in a first dielectric layer, the conductive structure including a first region and a second region extending from the first region, forming a second dielectric layer over the conductive structure and the first dielectric layer, forming a plurality of openings in the second dielectric layer, etching the first dielectric layer under at least a portion of the conductive structure.

A further understanding of the nature and advantages of the invention described herein may be realized by reference to the remaining portions of the specification and the attached drawings.

DESCRIPTION OF THE PREFERRED EMBODIMENTS

Figure 1:
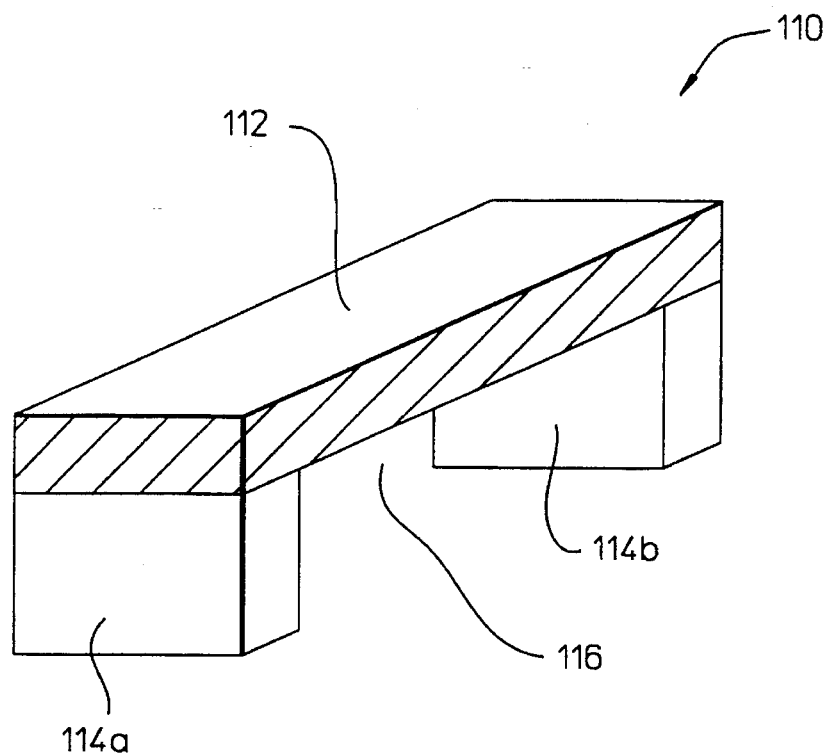
FIG. 1 shows an isometric view of an end-supported air bridge transmission line.
Figure 2:
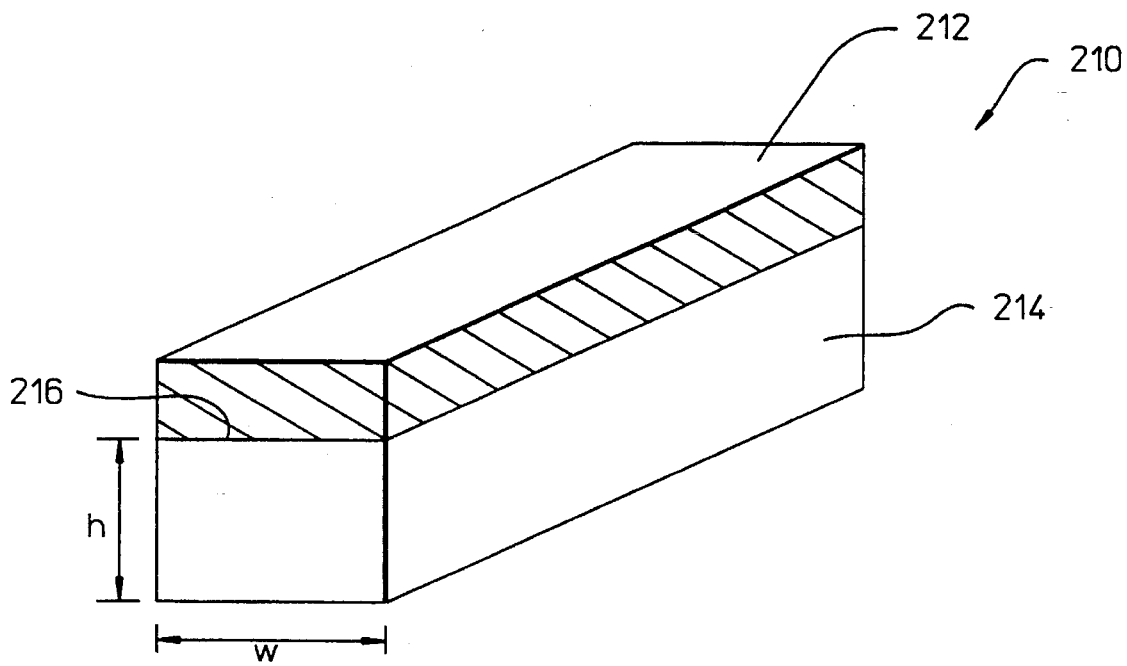
FIG. 2 shows an isometric view of a dielectric base air bridge transmission line.
Figure 3A:
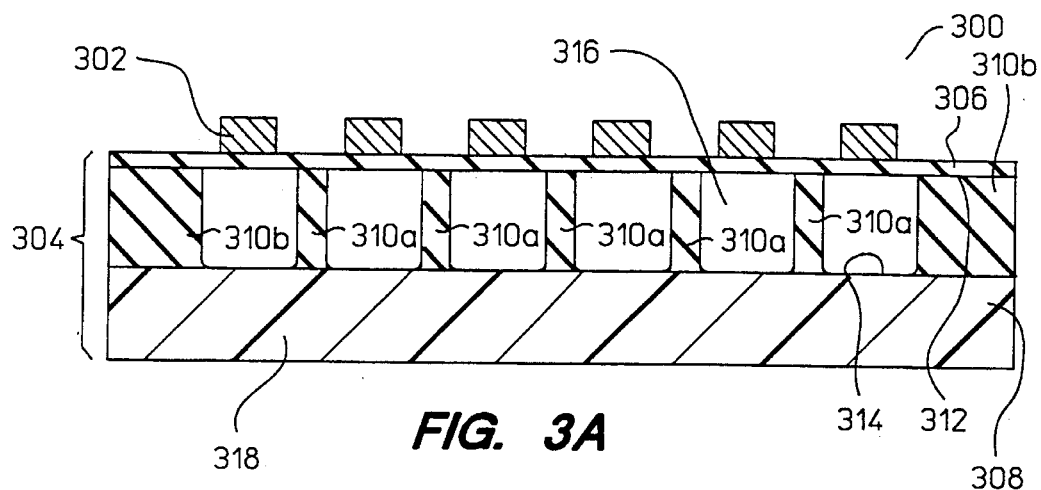
FIG. 3A shows a cross-sectional view of the air-dielectric transmission line structure with air pocket alignment according to one embodiment of the present invention.

FIG. 3A shows a cross-sectional view of a trestle support air-dielectric transmission line according to one embodiment of the present invention. The air-dielectric transmission line 300 is comprised of a conductive transmission line structure 302 and transmission line support structure 304. The transmission line support structure 304 has a "railway trestle-like" construction that provides a braced framework which supports the conductive transmission line 302. The trestle-like construction of the support structure 304 is comprised of a membrane-like structure 306 and a supporting base structure 308 separated by support members 310. The long axis of the support member 310a is typically positioned to form a 90 degree angle to a surface 312 of the membrane-like structure and a to the surface 314 of the supporting base structure providing stable mechanical support. Typically, there are a plurality of support members 310. The spaces between the support members 310 are typically not filled so that air pockets 316 are formed.

Although the support members 310 and the supporting base structure 308 may be formed from the same material to form an integral unitary structure such that the support members 310 extend from the substrate 308, in the embodiment shown in FIG. 3 the support member 310a and the supporting base structure 308 are formed from different materials. The supporting base structure 308 is typically formed from a semiconductor material such as silicon while the supporting members 310 are formed from a dielectric material such as silicon nitride or silicon dioxide.

Typically there are a plurality of central support members 310a and a pair of end support members 310b. The central support members 310a are surrounded by an air pocket on both sides of the support member 310a. Although the support members 310a typically are of a uniform height and width, the height and width of the support members may vary. Typically, the central support members 310a have a width $w_1$ and a height $h_1$ where the height $h_1$ is measured between a surface 312 of the membrane-like structure and a surface 314 of the supporting base structure 308. Similar to the central support members 310a, the end support members 310b have a height $h_1$, however, the end support members have an air pocket on one side and their width is variable.

The membrane-like structure 306 is a thin membrane that is supported by support members 310. The membrane-like structure 302 should be made as thin as possible to reduce capacitance as manifested by charge accumulation at the metal-insulator interface while still maintaining its structural integrity. The structure shown in FIG. 3 strengthens the air-bridge structure by shortening the unsupported span of the bridge by providing additional support members 310 along the transverse axis of the conductive structures 302. Typically the width $w_1$ of the support member 310 is very narrow so that the width $w_2$ of the conductive transmission line structure 302 is greater than the width $w_1$ of the support member 310. However, the width $w_1$ of the support member 310 is determined independently of the width $w_2$ of the transmission. It can be made very narrow or wider dependent on the required thermal conduction path and desired impedance characteristics and the location of the nearest ground plane, which might be a conducting layer with the supporting base structure 308. The support members 310a can be quite tall and thin provided there are end abutment support members 310b to stabilize the array of support members of the bridge support. The end support members 310b are easily positioned along the sides of a bus.

The conductive transmission line structure 302 is positioned above the interconnect support structure 304. The support structure 304 includes a plurality of support members 310 between the membrane-like structure 306 and the supporting base structure 308. Air pockets 316 are formed between the support members. In the embodiment shown in FIG. 3A, the sidewalls of the conductive structure 302 are centered or positioned between the sidewalls of a given central support member 310a.

Figure 3B:
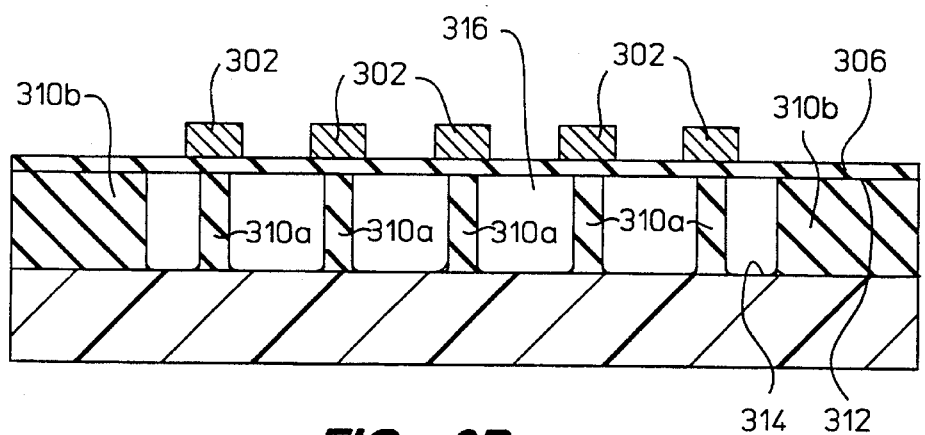
FIG. 3B shows a cross-sectional view of the air-dielectric transmission line structure with support member alignment according to one embodiment of the present invention.

Alternatively, the sidewalls of the conducting structures 304 may be centered between the sidewalls of a given air pocket 316. FIG. 3B shows a cross-sectional view of an alternative embodiment of the trestle support air bridge according to the present invention. However, unlike the embodiment shown in FIG. 3A where the sidewalls of the conductive transmission line structures 302 are centered between the air pocket structures 316, in the embodiment shown in FIG. 3B the sidewalls of the conductive structures 302 are centered around the support members 310a.

As another alternative, the conductive structures can have their longitudinal bus direction at a 90 degree angle relative to the support member major direction in the plane of the supporting base structure.

The configuration shown in FIG. 3B offers improved thermal characteristics compared to the embodiment shown in FIG. 3A without increasing inter-line capacitance. While this configuration increases capacitance by a controlled amount, inter-line capacitance is not increased. The structure shown in FIG. 3B allows design freedom regarding the total loading capacitance in terms of the ratio of support member width to transmission line width. At the same time the thermal resistance can be minimized by selecting a substrate material with a high ratio of thermal conductivity to dielectric permittivity.

Figure 3C:
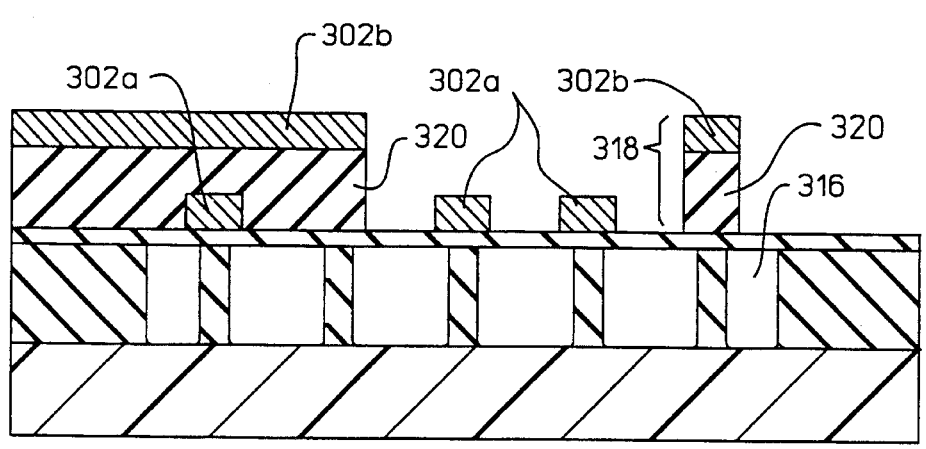
FIG. 3C shows a cross-sectional view of the two level metal configuration of the air-dielectric transmission line structure according to the present invention.

Electrical connection to the transistors in the underlying substrate or to other conductive transmission line structures is performed by the usual methods known in the art for making contacts and vias (not shown). FIG. 3C shows a cross-sectional view of the two level metal cross air-dielectric isolation structure according to one embodiment of the present invention. In one embodiment, the conductive structure includes a dielectric base 320 located between the membrane-like structure 306 and a second conductive transmission line structure 302b. The additional dielectric base layer 320 is used to provide electrical separation between the second conductive transmission line structure 302b and the bottom conductive transmission line structure 302a.

Multi-level metal systems are important in providing crossovers between two transmission lines. A simple and direct way to obtain the cross-over capability of two levels of metal is to process a conventional two level metal stack over the air bridge support as shown in FIG. 3C. Assuming fully planarized wiring, the interlevel dielectric provides a raised wire when this dielectric is anisotropically etched with the upper metal as a mask, as shown. Thus, even though there is a dielectric pedestal under conductive transmission line structure, most of the air surround features are preserved for the upper level if that pedestal is included in with the wire. Although there will be enhanced coupling capacitance at the metal cross overs, typically the impact of the random signals across the metal cross over will be small compared to the impact of transmission line coupling over a long distance.

FIG. 4 shows a cross-sectional view of the fabrication sequence of the trestle support air bridge for the embodiment shown in FIG. 3A. The process for formation of the trestle support interconnect structure includes the steps of: forming a first dielectric layer on a supporting base structure, forming a second dielectric layer having a plurality of openings on the first dielectric layer, forming a plurality of openings in the first dielectric layer where the sidewalls of the openings in the first dielectric layer extend past the sidewalls of the openings formed in second dielectric layer, closing the openings formed in the second dielectric layer, and forming a conductive transmission line structure on the surface of the second dielectric layer.

Figure 4A:
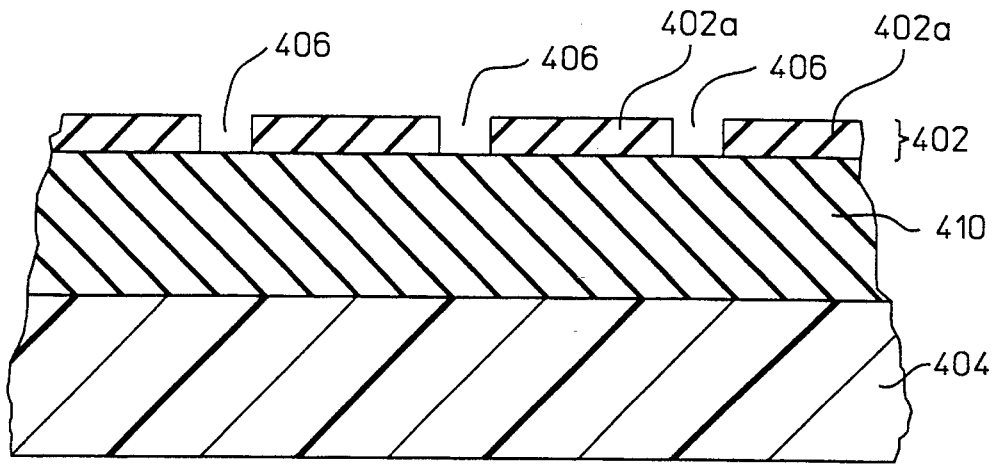
FIGS. 4A–4C show a cross-sectional view of the fabrication sequence of the air-dielectric transmission line structure for the embodiment shown in FIG. 3A.

Referring to FIG. 4A, a first step in formation of the interconnect structure is the formation of a first dielectric layer 410 on a substrate 404. The substrate 404 is typically comprised of a semiconductor starting material such as silicon having a <100> orientation. Typically the first dielectric layer is silicon nitride formed using techniques well known in the art, typically by chemical vapor deposition. Although silicon nitride is preferred, the dielectric layer 410 may be any nonconductive material having the appropriate etch characteristics and similar or better dielectric and thermal conductivity properties. For example, silicon dioxide may be used.

The second step is the formation of a second dielectric layer 402 on the surface of the first dielectric layer 410, typically silicon dioxide, grown using techniques well known in the art. The dielectric layer 402 is thin, typically in the range of a few hundred to one thousand angstroms. The dielectric layer 402 should be made as thin as possible to reduce capacitance as manifested by charge accumulation at the metal-insulator interface while still maintaining its structural integrity and sufficient etch resistance for the subsequent fabrication steps.

After deposition of the second dielectric layer 402, openings 406 are formed in the dielectric layer 402 using patterning techniques well known in the art leaving portions 402a of the dielectric layer 402 behind. Typically, an anisotropic etchant such as $CF_4$ is used to form openings 406. The anisotropic etchant reacts with the silicon dioxide dielectric layer 402 to form openings whose sidewalls are generally parallel and oriented orthogonally to the surface of the supporting base structure.

Figure 4B:
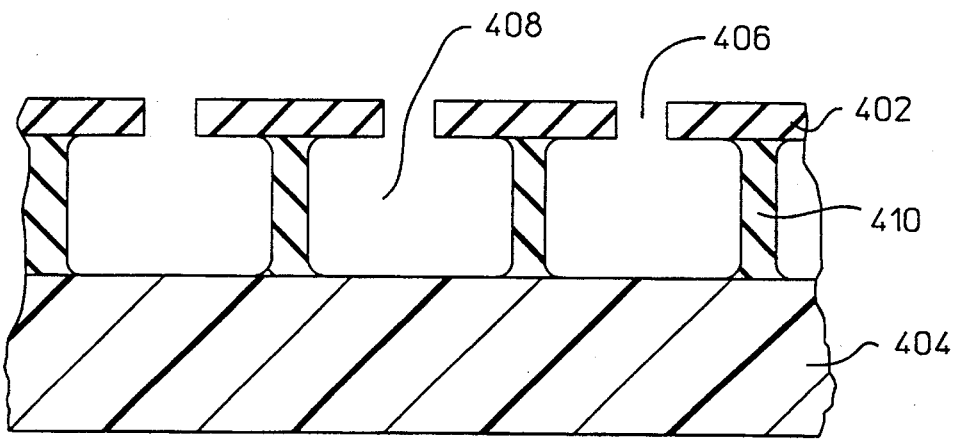

Referring to FIG. 4B, after formation of openings 406 in dielectric layer 402, openings 408 are formed in the dielectric layer 410. In the previous step of forming openings 406 in dielectric layer 402, a photoresist mask (not shown) is formed. This mask also serves to protect the second dielectric layer during the etching of openings 408 during application of an anisotropic etch.

Relying on the required property of good etch resistance to etching of the dielectric layer 402, the dielectric layer 402 is used as a mask during the second of the two etches. The first etch is anisotropic and goes down deep into the first dielectric layer 410, typically a micron or more. An etchant such as fluorine is typically used for the anisotropic etch. The second etch is isotropic and causes lateral undercut of the dielectric layer 410. An etchant such as $SF_6$ is typically used for the isotropic etch. This etchant is allowed to react to produce a controlled amount of lateral undercut by which the support members 410 of the desired height and width are formed.

The openings 406 in the second dielectric layer 402 are positioned in such a manner as to leave support members 410 having the desired width and location. This is accomplished by adjusting the space between the openings 406 in the dielectric layer 402 to be greater than the desired support member width by twice the lateral undercut. As explained below in conjunction with FIG. 5, where there are areas where large air pocket openings 408 are desired, the openings 406 are positioned closer than twice the lateral undercut so that the air pocket openings 408 are joined together. The size of each opening 406 must be maintained small enough to allow it to be closed over in a subsequent fabrication step.

The remaining structures after the second etch form narrow support members 410 having a height $h_1$ and width $w_1$ and act as the support between the membrane-like structure 402 and the supporting base structure 404. The sidewalls of the openings 408 in the first dielectric layer 410 extend past the sidewalls of the openings 406 formed in the second dielectric layer 402. After formation of the support members 410, the openings 406 in the second dielectric layer 402 are closed. Typically this is done by the isotropic deposition of a dielectric material to rebuild the dielectric layer. A deposition of dielectric measuring between 0.5 to 0.75 times the shortest dimension of the openings is typically required to close openings 406 and to provide a smooth sealed surface for subsequent processing. Although many methods of rebuilding the dielectric layer may be used, deposition of the dielectric material should continue until the openings in the first dielectric layer are closed and an integral dielectric layer is formed on top of the support members. Once formed, it may be desirable for minimizing inter-line capacitance to thin the integral dielectric layer by a uniform etch back.

Figure 4C:
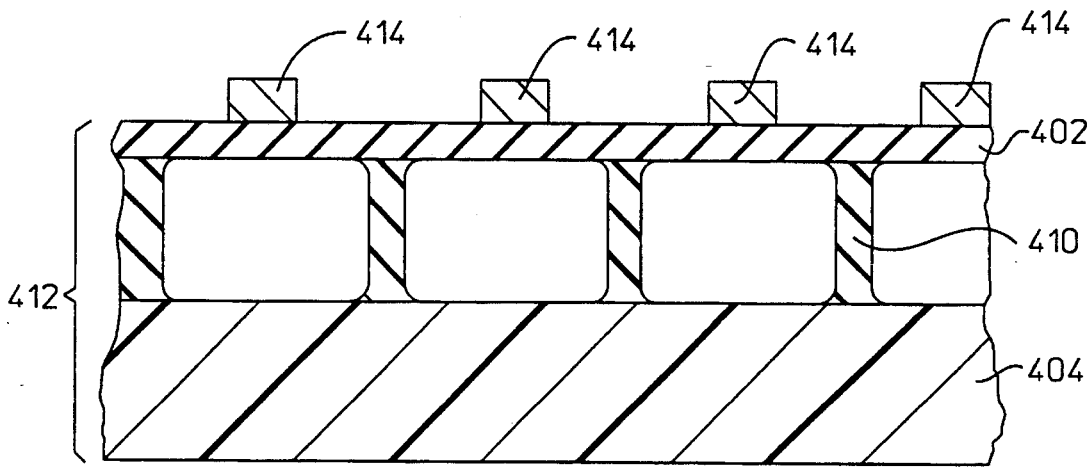

After closing the openings 406 in the second dielectric layer 402, a conductive transmission line structure is formed on top of the interconnect support structure 412. To form the transmission line, first a conductive layer 414 is formed on top of the dielectric layer 402. Next, using patterning techniques well known in the art, a mask (not shown) is formed over the regions where the conductive material desired. An etchant is applied remove portions of the metal layer 414 to form the conductive transmission line structures. FIG. 4C shows a cross-sectional view of the resultant structure after application of the etchant to form the conductive transmission line structures 414.

At the time of formation of the conductive transmission line structures, interconnecting contacts or vias can be fabricated using techniques well known in the art. After completion of the integral dielectric layer 402, a conventional contact may be etched and filled in areas where support members 410 are formed down to the underlying circuits in the silicon substrate with sufficient width to enclose the contact.

Formation of the multi-level metal air bridge shown in FIG. 3C requires the additional steps of: forming a dielectric layer and forming and patterning a conductive layer. The dielectric layer is formed using techniques well known in the art, typically by chemical vapor deposition. After formation of a dielectric layer, a conductive or metal layer is formed on the surface of the dielectric layer. Using well known patterning techniques, a second level of metal is formed.

Changing the width of the dielectric regions in the second dielectric layer changes the spacing between and the width of the support members formed so as to form air pockets of different dimensions. FIGS. 5A–5D show a cross-sectional view of the fabrication sequence of the air-dielectric transmission line corresponding to the fabrication sequence shown in FIG. 4. However, comparing FIGS. 4 and 5, the width of the dielectric regions between the openings in the second dielectric layers are different as can be achieved by a simple dimensional change of the mask pattern. Referring to FIG. 4, the width of each dielectric region between openings 402a is several times larger than and the space of each opening 406 but approximately constant for all openings. In contrast, in FIG. 5 the width of each dielectric region between the openings in the second dielectric layer 502 varies. Specifically, the width of the dielectric regions 502a and 502b between the openings 506 is smaller than the width of the dielectric regions 502o between the openings 506.

Figure 5A:
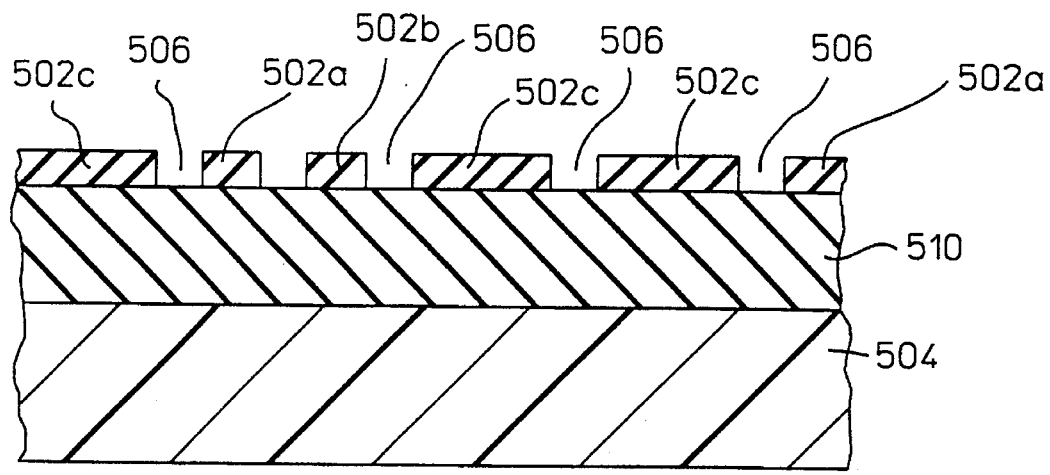
FIGS. 5A–5D show a cross-sectional view of the fabrication sequence of the air-dielectric transmission line for the embodiment shown in FIG. 3A.
Figure 5B:
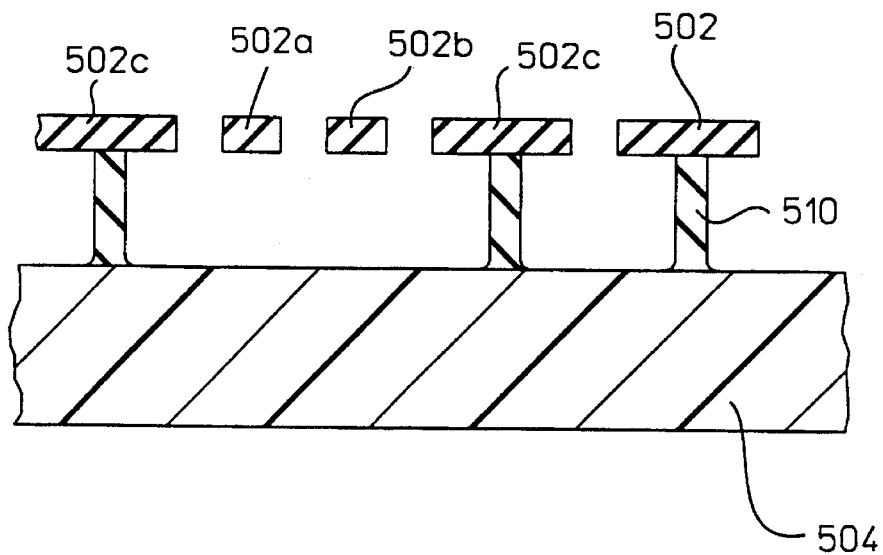
Figure 5C:
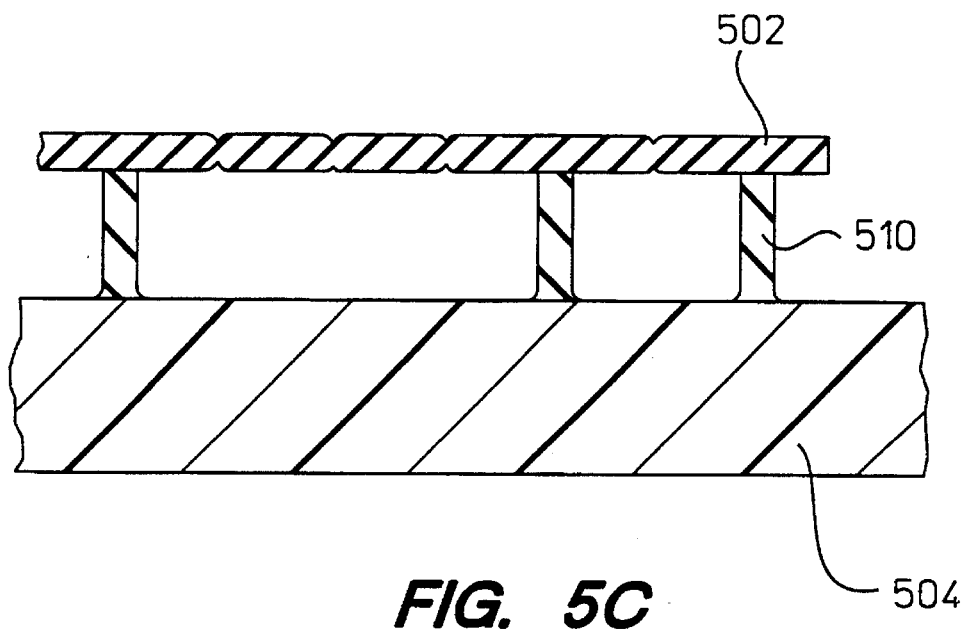
Figure 5D:
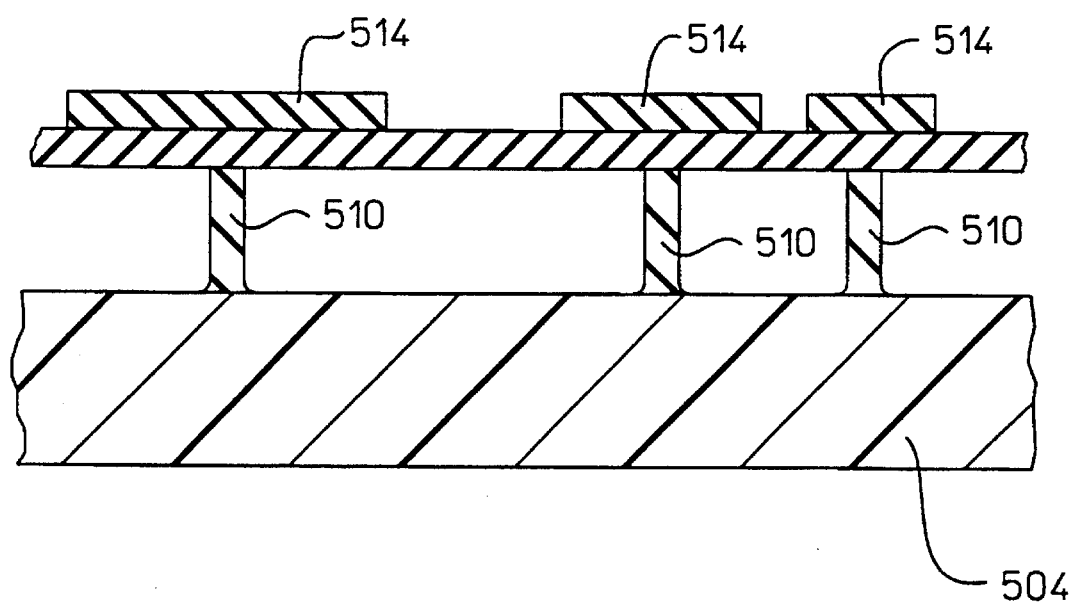

FIG. 5B shows the process sequence of the air-dielectric transmission line after the step of etching the first dielectric layer 510. Because of the width of the dielectric regions 502c, the support members 510 remain where the width of the dielectric region 502c is further apart while they are etched away where the width is smaller. In FIG. 5B the dielectric regions 502a and 502b appear to be suspended in space. The dielectric regions 502a and 502b are in fact supported out of the plane of the figure by membrane 502. After the step of depositing dielectric film on the substrate, the structure shown in FIG. 5C results. FIG. 5C shows what applicant believes to be a more representative vies of the closed thin dielectric layer 502 before an etch back step. The etch back step is believed to provide a more planar surface as is shown in FIG. 5D. FIG. 5D shows the resultant structure after an etch back step to planarize dielectric layer 502 and the step of forming conductive structures 514. As can be seen in FIG. 5, the conductive structures may vary in width dependent on the allowed spacing and desired performance characteristics.

FIG. 6 shows the process flow and resulting structures for a second embodiment of the present invention where the conductive transmission line structure is positioned below the membrane-like structure of the interconnect structure. The second embodiment is typically formed according to the following process sequence: forming a conductive structure in a first dielectric layer, the conductive structure including a first region and a second region extending from the first region, forming a second dielectric layer over the conductive structure and the first dielectric layer, removing the first dielectric layer under at least a portion of the conductive structure.

Figure 6A:
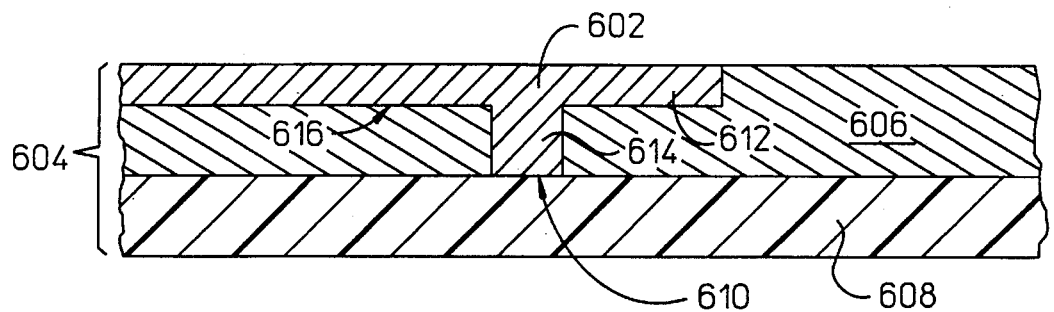
FIGS. 6A–6G show an alternative air-dielectric transmission line structure and fabrication sequence according to the present invention.

FIG. 6A shows a cross-sectional view of the process for formation of the second embodiment after formation of the conductive transmission line structure. In the embodiment shown in FIG. 6A, the conductive structure 602 is formed in the first dielectric layer 606. Typically the base perimeter 610 of the second region 614 of the conductive transmission line structure 602 coincides with the topmost boundary of the semiconductor supporting base structure 608. However, in an alternative embodiment, the base perimeter 610 of the second region 614 of the conductive transmission line structure 602 may extend below or alternatively past the topmost boundary of the semiconductor substrate 608. Further, referring to FIGS. 6D–6G the supporting members 618 and the supporting base structure 608 may alternatively be comprised of a single material.

In the preferred embodiment, the conductive transmission line structure 602 is a bilevel metal structure including at least a first region 612 and a second region 614 extending from the first region 612. Typically the second region 614 extends from the bottommost perimeter 616 of the first region.

The conductive transmission line structure 602 is typically formed by a dual damascene process although any method of forming a planarized conductive structure will work. The dual damascene approach refers to a method of making conducting via connections and conducting transmission lines by respectively etching holes in trenches in a dielectric layer using two successive masking operations followed by a metal fill and chemical mechanical polishing (CMP). The process sequence is formed using photolithographic techniques well know in the art and includes the steps of: forming an opening in the first dielectric layer corresponding to the second region of the conductive structure, forming an opening in the substrate corresponding to the first region of the conductive structure, filling the openings corresponding to first and second regions of the conductive structure with a conductive material and polishing off the excess metal to leave a planar surface.

Figure 6B:
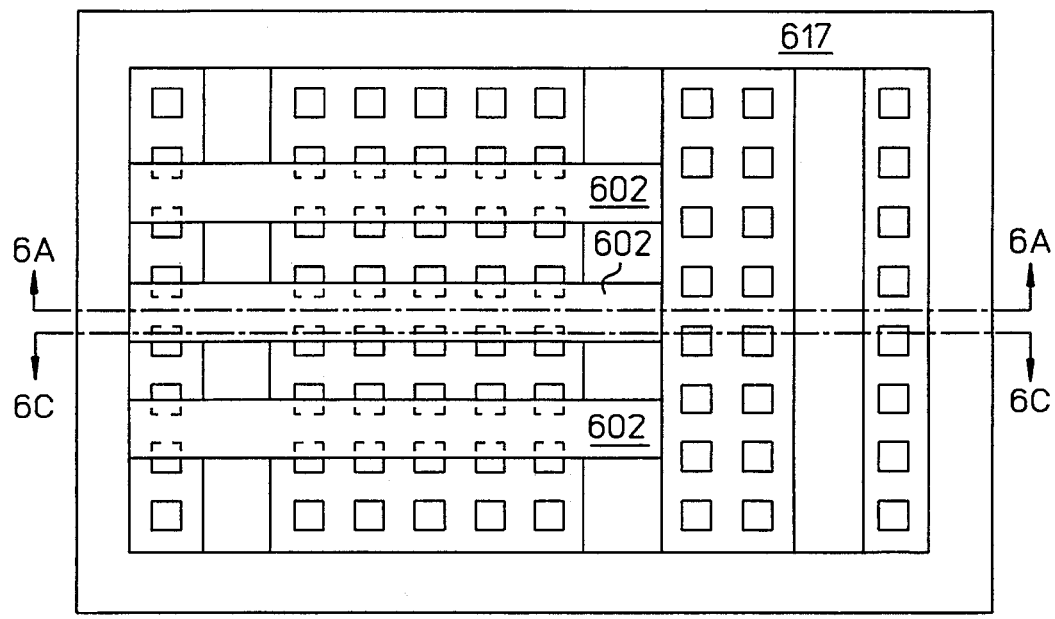
Figure 6C:
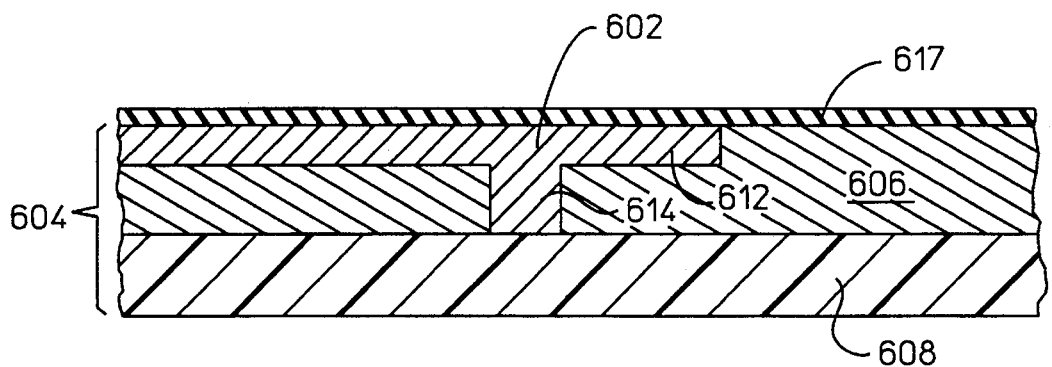
Figure 6D:
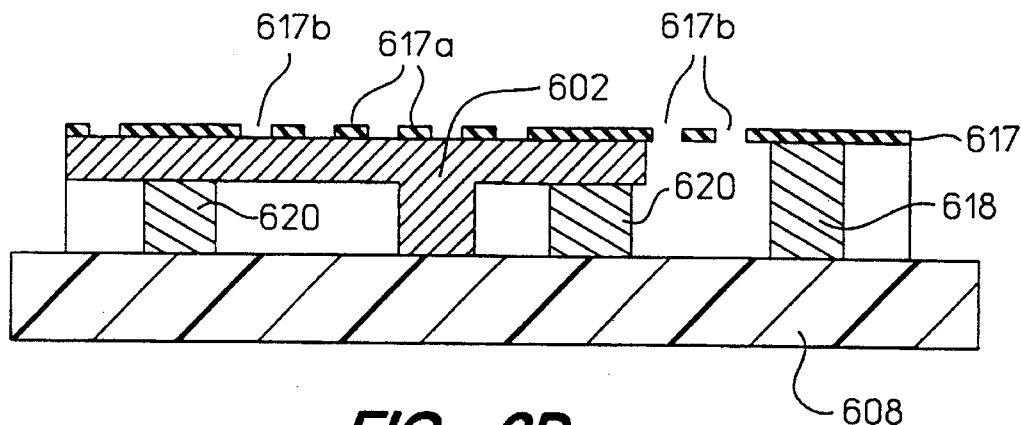

Referring to FIGS. 6B–6D, after formation of the conductive transmission line structure 602 in the first dielectric layer, a second dielectric layer 617 is formed on the surface of the first dielectric layer 606 and the conductive transmission line structure 602. The nonconductive layer 617 is a thin layer, typically silicon dioxide, and forms the thin membrane-like structure of the interconnect structure. A plurality of openings are formed in the second dielectric layer 617 which acts as a masking layer. FIG. 6B shows a top view of the air-dielectric transmission line according to the second embodiment of the present invention after the step of etching the openings in the second dielectric layer 617.

Figure 6E:
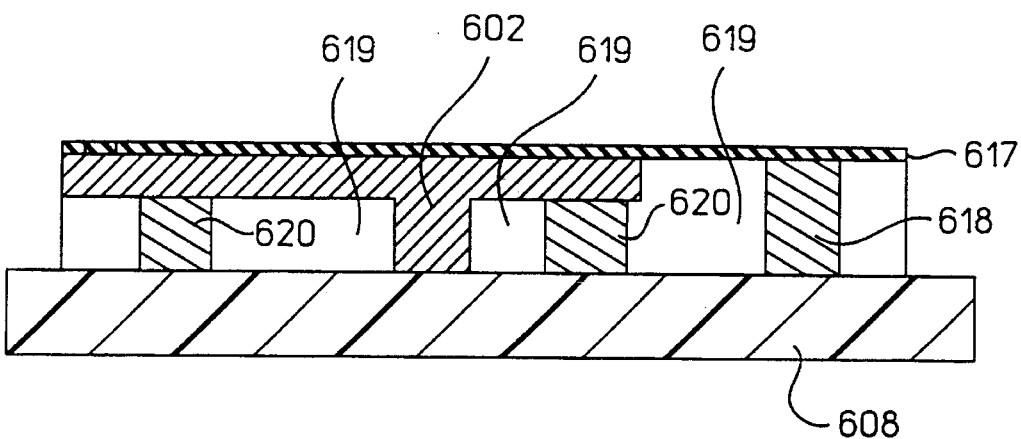

FIGS. 6B and 6C show a cross-sectional view of the resultant structure before the step of etching at least a portion of the first dielectric layer under the conductive structure. FIG. 6C shows a cross-sectional view along line A—A of FIG. 6B before the step of removing a portion of the first dielectric layer under the conductive transmission line structure 602. FIG. 6D shows a cross-sectional view along line B—B of FIG. 6B after the step of removing at least a portion of the first dielectric layer beside and under the conductive transmission line structure 602. FIG. 6E shows a cross-sectional view of the air-dielectric transmission line along line A—A after the step of etching the substrate under at least a portion of the conductive structure 602.

As described in connection with FIG. 4B, the etch is done in two steps, an anisotropic etch and an isotropic etch. Referring to FIGS. 6B–6E, it can be seen that second dielectric layer 617 acts as a mask during the isotropic etching process, and the support members 618, 620 under the second dielectric layer 617 is dependent on the placement of the openings in the second dielectric layer. The etchant used is a selective etchant which removes exposed portions of the first dielectric layer material but leaves the material of the conductive transmission line structure intact. FIG. 6E shows the resulting membrane support structures 618 and conductor support structures 620 after the step of removing portions of the first dielectric layer 606. The conductor support structures 620 are formed between a surface of the supporting base structure 608 and a surface of the conductive transmission line structure 602. The dielectric support structures are formed between the supporting base structure 608 and the second dielectric layer 617. Air pockets 619 are thereby created to form the air-bridge supporting structure.

Figure 6G:
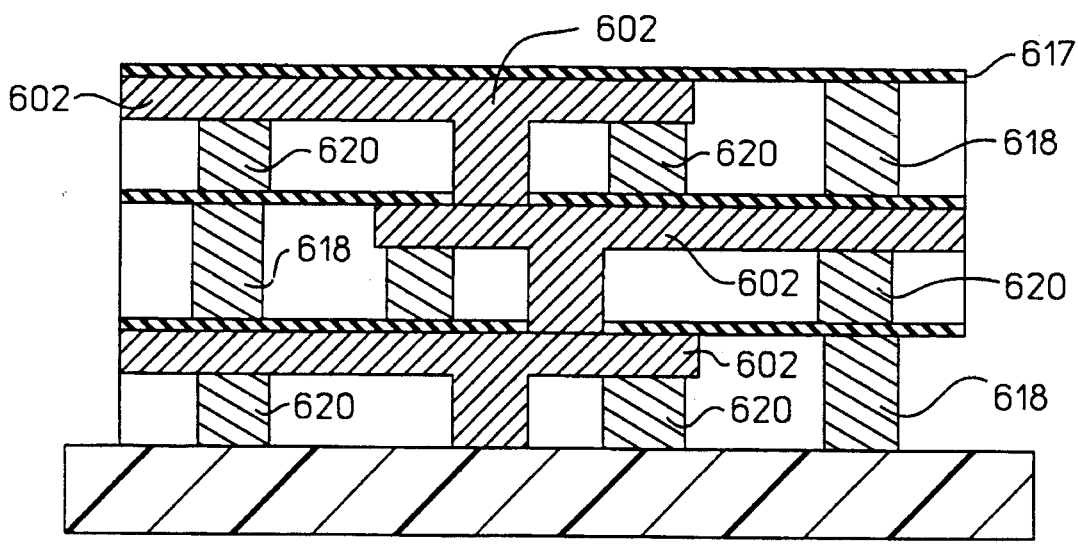

FIG. 6D–6G shows a cross-section view of the resulting air-dielectric transmission line structure where the conductive transmission line structure is positioned below the membrane-like support structure. The air-dielectric transmission line is comprised of a conductive transmission line structure 602 and an integrated support structure. The support structure again has a "railway trestle-like" construction that provides a braced framework. The distinction of the structure of FIG. 6 from that in FIG. 3 is that the conductive transmission line structure 602 is positioned below the membrane-like structure 617. The role of the membrane-like structure 617 is to support another subsequent transmission line layer placed above it. By repeating the layer structure additional times, a multilayer interconnect system is obtained as shown in FIG. 6G and cross-overs are provided inherently.

Figure 6F:
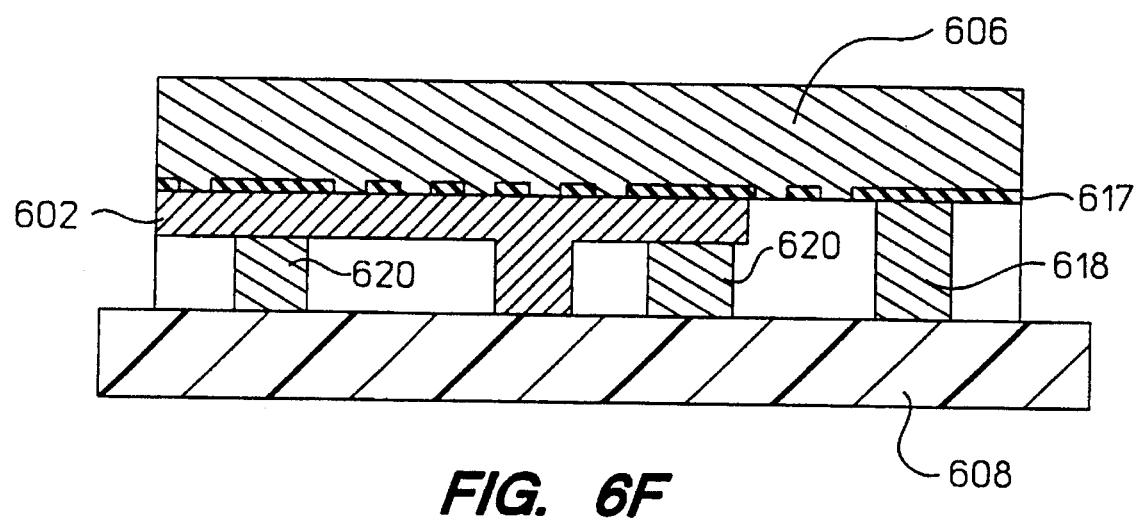

FIG. 6F shows FIG. 6D after formation a "first dielectric" layer for a second level of a multi-level structure along line B—B. It acts to seal the openings 617b in a manner similar to that shown in FIG. 5C but with a thick rather than thin layer. The small size of the holes cut in the thin dielectric layer allows the formation of this dielectric layer without refilling the etched air pockets 619. The structure shown in FIG. 6G is formed by repeating the process to form the next interconnect level. In the upper interconnect levels, the dielectric support members 618 are typically formed between two thin dielectric layers 617, in contrast to the lower interconnect levels shown in FIG. 6E where the dielectric support members are formed between the supporting base structure 608 and a thin dielectric layer 617. In the upper interconnect levels, the conductor support members 620 (the support members which support the conductive structure 602) are typically formed between the conductive transmission line structure and the thin dielectric layer instead of between the conductive transmission line structure and the supporting base structure. To ensure interconnection between conductive transmission line structures, a portion of the thin dielectric between conductive transmission line structures must be removed before the step of forming the upper conductive transmission line structure.

After formation of the conductive transmission line structure and its corresponding contact structures, a passivation layer is formed to ensure proper passivation of the circuit elements. If the air pockets are not connected to the ambient, only the outside surface will require a passivation layer. In the embodiment of FIG. 6, the top membrane-like structure can be filled prior to the application of the passivation layer. Since the object is to improve long distance transmission lines, in the embodiment of FIG. 3C the conductor size will likely not be determined by lithographic limitations but rather by electromagnetic considerations, particularly line resistance. Thus if these lines are several microns across, a thin conformal passivation layer is practical and the overall dielectric loading will be minimally affected.

It is understood that the above description is intended to be illustrative and not restrictive. For example, other processes than the dual damascene process may be used to build the embodiment shown in FIG. 6. Further, the multilevel interconnect systems described in FIG. 3C may be combined, one above the other with the dual damascene forming the lower levels. The scope of the invention should therefore be determined not with reference to the above description, but instead should be determined with reference to the appended claims, along with the full scope of equivalents to which such claims are entitled.

What is claimed is:

1. An interconnect structure in an integrated circuit device comprising:

a first membrane-like structure having first and second opposite surfaces;

a supporting base structure having a first surface;

a first set of support members positioned between the first surface of the first membrane-like structure and the first surface of the supporting base structure, the first set of support members being generally orthogonal to the first surface of the first membrane-like structure and the first surface of the supporting base structure, the first set of support members being comprised of a dielectric material; and a first conductive structure positioned adjacent to the first membrane-like structure;

wherein the sidewalls of the first conductive structure are centered around the sidewalls of a given corresponding first set of support members.

2. An interconnect structure in an integrated circuit device comprising:

a first membrane-like structure having first and second opposite surfaces;

a supporting base structure having a first surface;

a first set of support members positioned between the first surface of the first membrane-like structure and the first surface of the supporting base structure, the first set of support members being generally orthogonal to the first surface of the first membrane-like structure and the first surface of the supporting base structure, the first set of support members being comprised of a dielectric material; and a first conductive structure positioned adjacent to the first membrane-like structure;

wherein air pockets are formed between the support members, wherein the sidewalls of the first conductive structure are located between the sidewalls of the air pocket.

3. An interconnect structure in an integrated circuit device comprising:

a first membrane-like structure having first and second opposite surfaces;

a supporting base structure having a first surface;

a first set of support members positioned between the first surface of the first membrane-like structure and the first Surface of the supporting base structure, the first set of support members being generally orthogonal to the first surface of the first membrane-like structure and the first surface of the supporting base structure, the first set of support members being comprised of a dielectric material; and a first conductive structure positioned both adjacent to and below the first membrane-like structure, wherein a first air pocket is formed beneath at least a portion of the first conductive structure:

wherein a first surface of the first conductive structure forms a sidewall of a first air pocket.

* * * * *